(12) United States Patent
Lee et al.

(10) Patent No.: US 6,747,304 B2
(45) Date of Patent: Jun. 8, 2004

(54) METHOD FOR FORMING A BIT LINE FOR A SEMICONDUCTOR DEVICE

(75) Inventors: Jung Hoon Lee, Seoul (KR); Chi Sun Hwang, Daejon-shi (KR)

(73) Assignee: Hyundai Electronics Industries Co., Ltd., Ich'on (KR)

( * ) Notice: Subject to any disclaimer, the term of this patent is extended or adjusted under 35 U.S.C. 154(b) by 0 days.

(21) Appl. No.: 10/673,571

(22) Filed: Sep. 30, 2003

(65) Prior Publication Data

US 2004/0061145 A1 Apr. 1, 2004

Related U.S. Application Data

(62) Division of application No. 09/751,940, filed on Jan. 2, 2001, now Pat. No. 6,649,501.

(30) Foreign Application Priority Data

Dec. 31, 1999 (KR) ........................................ 1999-68039

(51) Int. Cl.[7] .......................................... H01L 21/8242
(52) U.S. Cl. ...................................... 257/296; 257/306
(58) Field of Search ................................ 257/295–311

(56) References Cited

U.S. PATENT DOCUMENTS

| 5,170,243 A | 12/1992 | Dhong et al. |
| 5,229,326 A | 7/1993 | Dennison et al. |
| 5,682,055 A | 10/1997 | Huang et al. |
| 6,008,085 A | 12/1999 | Sung et al. |
| 6,133,599 A | 10/2000 | Sung et al. |
| 6,384,439 B1 * | 5/2002 | Walker ........................ 257/296 |

* cited by examiner

Primary Examiner—H. Jey Tsai
(74) Attorney, Agent, or Firm—Pillsbury Winthrop LLP

(57) ABSTRACT

The present invention discloses a method for forming a bit line of a semiconductor device which can easily perform a contact process of the semiconductor device, by forming parallel rows of I-shaped active regions, a plug poly and a ladder-type bit line. The spacing between adjacent active regions is maintained at the minimum line width. Two word lines of minimum line width and separated by the minimum line width are formed on the active region. The word lines are perpendicular to the active regions. A plug poly is formed on the active region between the word lines. A bit line contact plug is formed over the plug poly and a device isolation region. A bit line of minimum line width contacts the bit line contact plug and aligned generally parallel to the word lines is formed in a ladder-type configuration. That is, one side the lower portion of the contact plug contacts the plug poly, and the upper portion of the other side of the contact plug contacts the bit line. As a result, a storage electrode contact process may be performed using a self aligned method.

2 Claims, 6 Drawing Sheets

METHOD FOR FORMING A BIT LINE FOR A SEMICONDUCTOR DEVICE

This is a divisional application of U.S. patent application Ser. No. 09/751,940, which was filed on Jan. 2, 2001, now U.S. Pat. No. 6,649,501, and the content of which are incorporated herein in their entirety.

BACKGROUND OF THE INVENTION

1. Field of the Invention

The present invention relates to a method for forming a bit line for a semiconductor device and, in particular, to an improved method for forming a bit line for a semiconductor device that also improves the contact process for the semiconductor device.

2. Description of the Background Art

If the minimum line width of a conventional DRAM cell is 'F', then the size of the unit cell will typically be approximately $10F^2$.

Recent work has led to suggestions for a method of reducing the cell size to $8F^2$. It appears that a cell size reduction from of $10F^2$ to a cell size of $8F^2$ may be achieved without fundamentally changing the conventional processes and concepts.

However, a new cell layout and process concept are required in order to reduce the cell size to $6F^2$. That is, using conventional methods, the cell size of $6F^2$ cannot be employed successfully for a highly integrated device.

SUMMARY OF THE INVENTION

Accordingly, it is an object of the present invention to provide a method for forming a bit line for a semiconductor device that can be used to fabricate a highly integrated semiconductor device having a cell size of $6F^2$, by forming I-type active regions and a ladder-type bit line contacting the active regions in order to simplify subsequent contact processing.

In order to achieve the above-described object of the present invention, there is provided a method for forming a bit line for a semiconductor device, including the steps of: forming I-type active regions having a minimum line width on a semiconductor substrate, each active region being separated from adjacent active regions by the minimum line width distance; forming word lines having a minimum line width that are generally perpendicular to the I-type active regions, a pair of word lines crossing each I-type active region that leave three portions of the I-type active region exposed; forming a plug poly (polysilicon) on the active region between the word lines; forming an interlayer insulation film over the resultant structure; forming a bit line contact plug that overlaps the plug poly by a predetermined width; and forming a bit line having a minimum line width that overlaps the bit line contact plug by a predetermined width, the bit lines being oriented generally perpendicular to the word lines and generally parallel to the I-type active regions.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for forming a bit line of a semiconductor device in accordance with the present invention will now be described in detail with reference to the accompanying drawings.

Figure 1A:
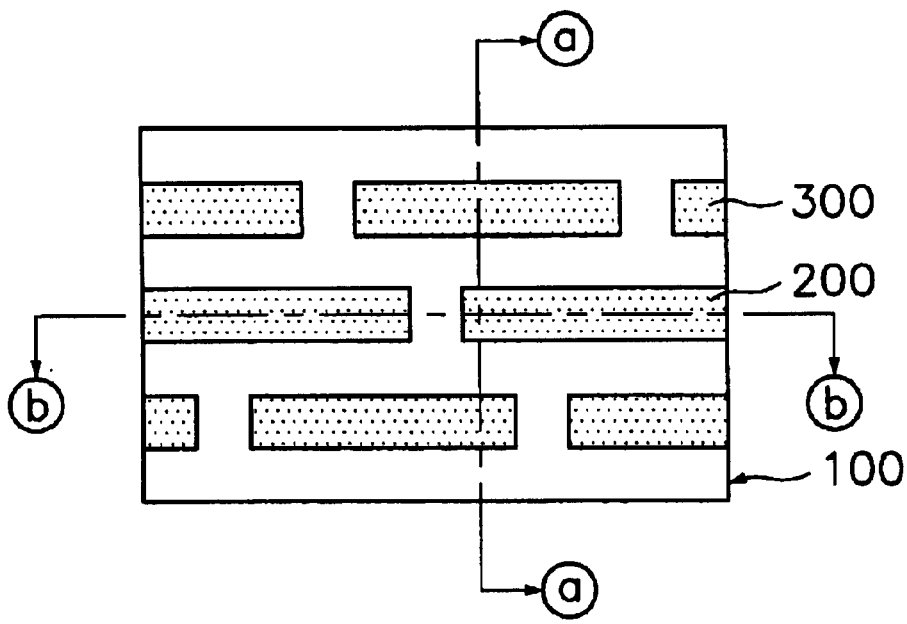
FIGS. 1A to 1D are layout diagrams illustrating sequential steps of a method for forming a bit line of a semiconductor device in accordance with the present invention.

As illustrated in FIG. 1A, a device isolation film 300 for defining rows of active regions 200 is formed on a semiconductor substrate 100. Here, the active regions 200 have an I-type, or I-shaped, configuration having a minimum line width, and are separated in both the lateral and the longitudinal directions by the minimum line width. In addition, the rows of active regions 200 are aligned in the longitudinal direction with active regions in adjacent rows being offset by one third of the pitch in the longitudinal direction. Here, the pitch refers to the distance between one side of the active region and the corresponding side of a laterally adjacent active region.

Figure 1B:
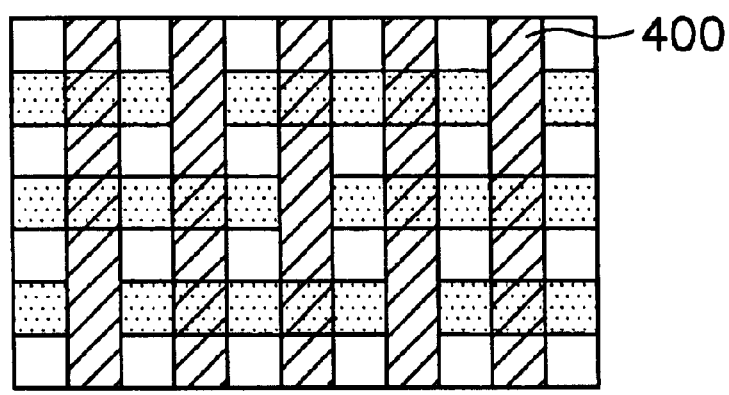

Referring to FIG. 1B, two word lines 400 are formed to cross the upper portions of each active region 200. Here, the word lines 400 are formed having the minimum line width and positioned to divide each active region into three portions. The word lines 400 have a stacked structure of a conductive layer 15 for the word line, a tungsten silicide layer 17 and a mask oxide film 19. Insulation film spacers 21 for the word line are formed at the sidewalls thereof.

Thereafter, a plug poly (not shown) designed to be positioned above and contact the active regions 200 is formed between the word lines 400.

An interlayer insulation film (not shown) is formed over the resultant structure for planarization.

Figure 1C:
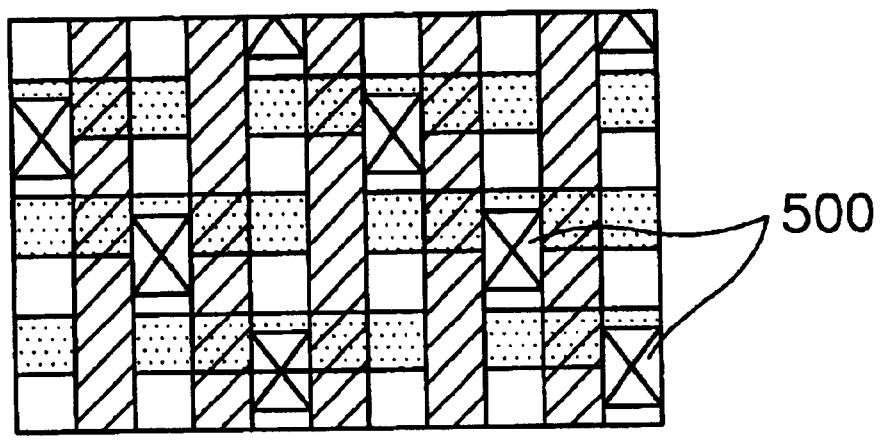

As shown in FIG. 1C, a bit line contact plug 500 is then formed to overlap the plug poly above the active region 200 between the two word lines 400 by 30 to 70%.

Figure 1D:
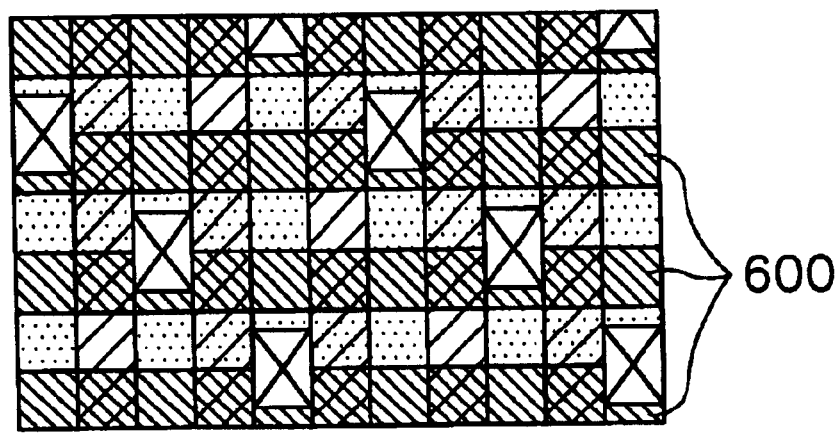

As depicted in FIG. 1D, a bit line 600 contacting the bit line contact plug 500 is then formed. Preferably, the bit line 600 is perpendicular to the word lines 400 and parallel to the rows of active regions 200. In addition, the bit line 600 overlaps the bit line contact plug 500 by 30 to 70%.

Figure 2A:
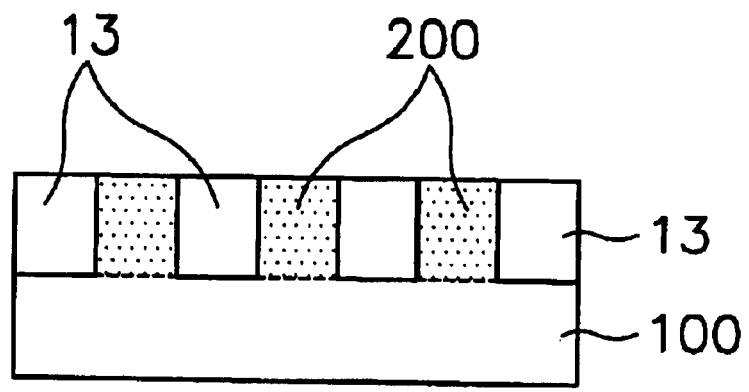
FIGS. 2A to 2F are cross-sectional diagrams illustrating sequential steps of the method for forming the bit line of the semiconductor device, taken along line I'–I" in FIG. 1A.
Figure 2B:
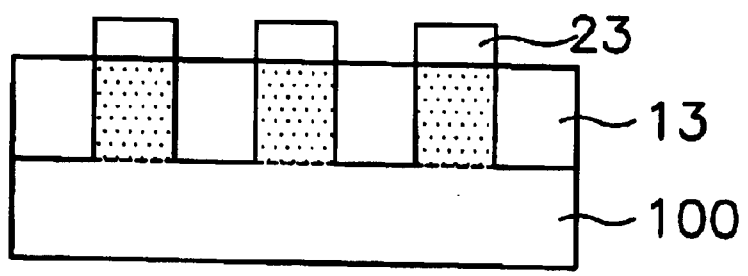
Figure 2C:
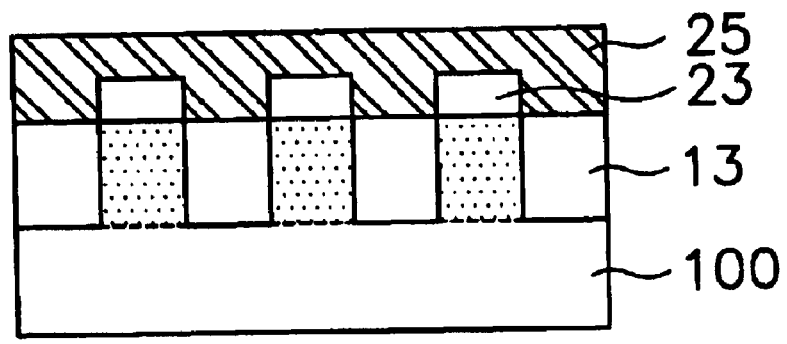
Figure 2D:
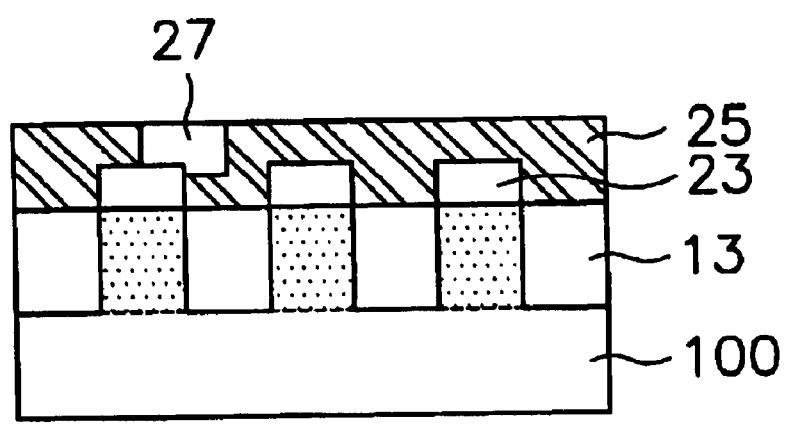
Figure 2E:
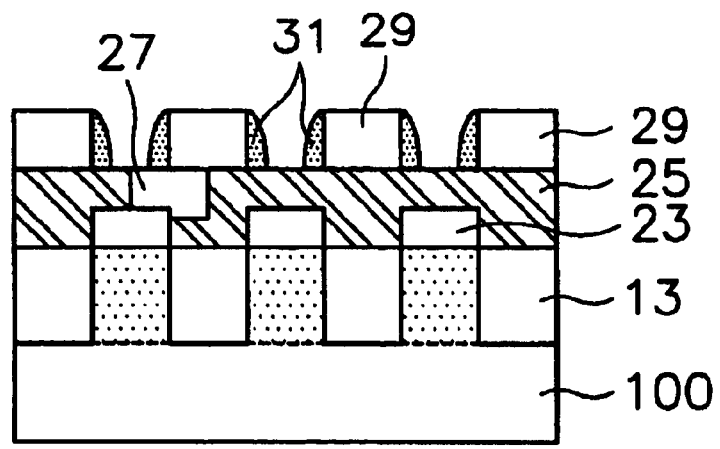
Figure 2F:
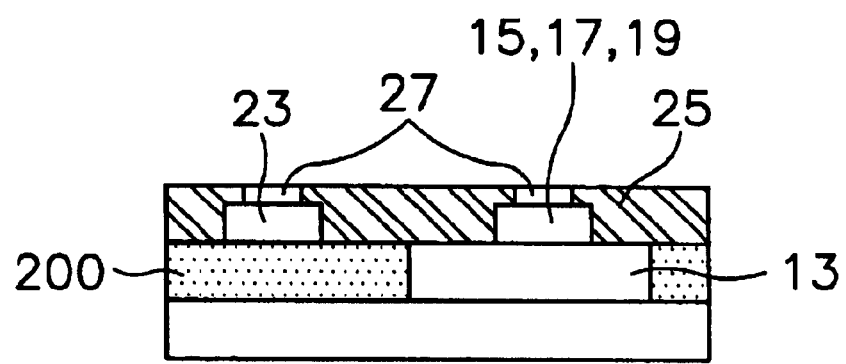

FIGS. 2A to 2E are cross-sectional diagrams illustrating sequential steps of the method for forming the bit line in a cell region, taken along line I'–I" in FIG. 1A, and FIG. 2F is a cross-sectional diagram illustrating the method for forming the bit line in a peripheral circuit region, taken along line I'–I" in FIG. 1A.

As illustrated in FIG. 2A, a device isolation film 13 for defining the active regions 200 is formed on the semiconductor substrate 100.

Referring to FIG. 2B, a plug poly 23 is formed on the active regions 200 after forming word lines (not shown).

As shown in FIG. 2C, an interlayer insulation film 25 is formed over the resultant structure.

As depicted in FIG. 2D, a bit line contact hole exposing the plug poly 23 is formed, and a bit line contact plug 27 is formed to fill up the bit line contact hole.

Here, the bit line contact plug 27 is overlapped with the plug poly 23 by 30 to 70%.

Referring to FIG. 2E, a bit line 29 is formed to contact the bit line contact plug 27, and insulation film spacers 31 for the bit line are formed at the side walls of the bit line 29.

At this time, the bit line 29 is overlapped with the bit line contact plug 27 by 30 to 70%.

Figure 3A:
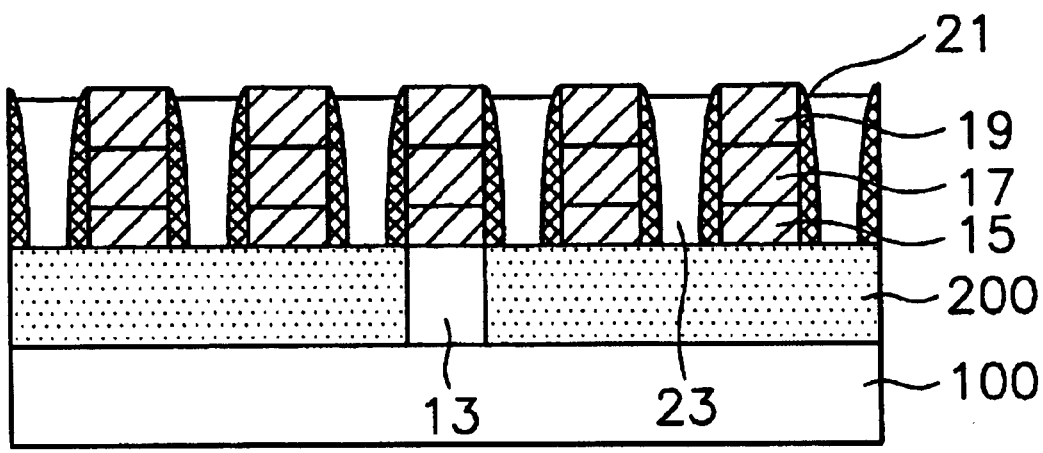
FIGS. 3A and 3B are cross-sectional diagrams illustrating sequential steps of the method for forming the bit line of the semiconductor device, taken along line II'–II" in FIG. 1A.
Figure 3B:
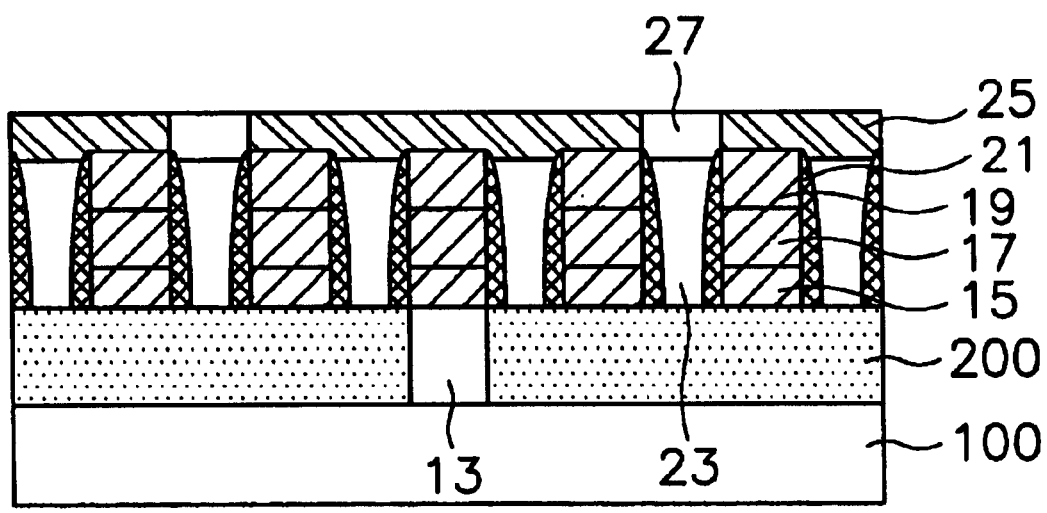

FIGS. 3A and 3B are cross-sectional diagrams illustrating sequential steps of the method for forming the bit line, taken along line II'–II" in FIG. 1A. Here, the word lines 400 and the plug poly 23 are illustrated in more detail.

As illustrated in FIG. 3A, the device isolation film 13 for defining the active regions 200 is formed on the semiconductor substrate 100.

The word lines are formed on the active regions 200 and the device isolation film 13.

Here, the word line 400 has a stacked structure of the conductive layer 15 for the word line, tungsten silicide layer 17 and mask oxide film 19. The insulation film spacers 21 for the word line are formed at the sidewalls thereof. The thickness of the mask oxide film 19 ranges from 3000 to 10000 Å. A nitride film of similar thickness may be used instead of the mask oxide film 19.

The plug poly 23 is formed on the active region 200 between the word lines 400.

As depicted in FIG. 3B, the interlayer insulation film 25 is formed over the resultant structure. Here, a thickness of the interlayer insulation film 25 corresponds to 30 to 40% of the thickness of the mask oxide film 19.

Thereafter, the bit line contact hole exposing the plug poly 23 between the interlayer insulation films 25 is formed, and the bit line contact plug 27 is formed to fill up the bit line contact hole is formed.

As discussed earlier, in accordance with the present invention, the bit line is formed so that the bit line contact plug can be overlapped with the plug poly by a predetermined width, and thus a succeeding storage electrode contact process can be formed using a self aligned method.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A semiconductor device formed on a semiconductor substrate comprising active regions, bit lines, first conductive plugs, second conductive plugs, and word lines and characterized by a minimum line width "F", and a minimum spacing width, and a cell size of less than $8F^2$ comprising:

parallel rows of active regions of minimum line width and a basic rectangular shape arranged in the semiconductor substrate with adjacent active regions being separated by the minimum spacing width;

parallel columns of word lines of minimum line width arranged in a direction perpendicular to the parallel rows of active regions with adjacent word lines being separated by the minimum spacing, the word lines being positioned to that two word lines cross each active region leaving three uncovered portions, a center portion and two end portions, in each active region; an insulating film formed between the word lines;

first conductive plugs positioned between adjacent bits lines and contacting an uncovered portion of an active region;

an interlayer insulating film formed above the first conductive plugs;

bit line contact plugs positioned above, partially overlapping, and in contact with the first conductive plugs; and parallel rows of bit lines of minimum line width arranged in a direction parallel to the parallel rows of active regions with adjacent bit lines being separated by the minimum spacing, the bit lines being positioned to partially overlap and contact the bit line contact plugs.

2. A DRAM device comprising a plurality of DRAM cells formed on a semiconductor substrate, each DRAM cell being characterized by a minimum line width, F, and a minimum spacing, S, wherein the area of a single DRAM cell is less than $8F^2$ comprising:

active regions in the semiconductor substrate, the active regions being characterized by the minimum width F and a length of at least about 5F, wherein the active regions are arranged in parallel rows and separated from adjacent active regions by the minimum spacing S, and further wherein active regions in adjacent rows are offset from each other in a longitudinal direction;

word lines, each word line being characterized by the minimum width F, wherein each word line is parallel to, and separated by the minimum spacing S from, adjacent word lines, and further wherein the word lines are perpendicular to the rows of active regions;

an insulating film formed over the word lines; first conductive plugs extending through the insulating film between adjacent word lines and making contact to portions of the active regions between adjacent word lines;

an interlayer insulating film formed over the first conductive plugs;

second conductive plugs extending through the interlayer insulating film, the second conductive plugs partially overlapping and contacting the first conductive plugs; and bit lines that partially overlap and make contact with the second conductive plugs, the bit lines being characterized by the minimum line width F, wherein adjacent bit lines are parallel and separated by the minimum spacing S, and further wherein the bit lines are oriented in a direction parallel to the rows of active regions.

* * * * *